(12) United States Patent
    Namba

(10) Patent No.: US 10,312,115 B2
(45) Date of Patent: Jun. 4, 2019

(54) SUBSTRATE PROCESSING APPARATUS

(71) Applicant: SCREEN Holdings Co., Ltd., Kyoto (JP)

(72) Inventor: Toshimitsu Namba, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 641 days.

(21) Appl. No.: 14/856,941

(22) Filed: Sep. 17, 2015

(65) Prior Publication Data

US 2016/0093515 A1     Mar. 31, 2016

(30) Foreign Application Priority Data

Sep. 30, 2014  (JP) ................................ 2014-200695

(51) Int. Cl.
    *H01L 21/67*     (2006.01)
(52) U.S. Cl.
    CPC .... *H01L 21/6708* (2013.01); *H01L 21/67017* (2013.01); *H01L 21/67115* (2013.01)
(58) Field of Classification Search
    CPC ........... H01L 21/6708; H01L 21/67115; H01L 21/67017
    See application file for complete search history.

(56) References Cited

U.S. PATENT DOCUMENTS

| | | | | |
|---|---|---|---|---|
| 5,923,356 A * | 7/1999 | Gibson | ................ | G03G 15/105 347/131 |
| 6,164,297 A | 12/2000 | Kamikawa | ....................... | 134/61 |
| 6,510,859 B1 | 1/2003 | Kamikawa | ....................... | 134/61 |
| 2002/0050322 A1 * | 5/2002 | Kunisawa | ........... | H01L 21/6838 156/345.11 |
| 2005/0067101 A1 | 3/2005 | Funabashi | ................ | 156/345.18 |
| 2006/0185544 A1 * | 8/2006 | Sasayama | ............. | G03F 7/3071 101/463.1 |

(Continued)

FOREIGN PATENT DOCUMENTS

| CN | 1914710 A | 2/2007 |
|---|---|---|
| CN | 102437050 A | 5/2012 |

(Continued)

OTHER PUBLICATIONS

Office Action dated Dec. 11, 2017 in related U.S. Appl. No. 14/659,716.

*Primary Examiner* — Michael E Barr
*Assistant Examiner* — Benjamin L Osterhout
(74) *Attorney, Agent, or Firm* — Ostrolenk Faber LLP

(57) ABSTRACT

A processing liquid is supplied from a supply tank to a processing liquid nozzle of a processing unit, and the processing liquid is supplied from the processing liquid nozzle to a substrate. The processing liquid used in the processing unit is collected and selectively supplied to first and second replenishment tanks. In a period in which the used processing liquid is supplied to the first replenishment tank, the supply tank is replenished with the processing liquid in the second replenishment tank, and the processing liquid in the first replenishment tank circulates while being heated by a heater. In a period in which the used processing liquid is supplied to the second replenishment tank, the supply tank is replenished with the processing liquid in the first replenishment tank and the processing liquid in the second replenishment tank circulates while being heated by the heater.

10 Claims, 8 Drawing Sheets

(56) References Cited

U.S. PATENT DOCUMENTS

| | | | |
|---|---|---|---|
| 2006/0188412 A1 | 8/2006 | Takahashi | 422/105 |
| 2008/0035609 A1 | 2/2008 | Kashkoush et al. | 216/84 |
| 2008/0066863 A1 | 3/2008 | Kiyose et al. | 156/345.15 |
| 2009/0017638 A1 | 1/2009 | Yoshino et al. | 438/758 |
| 2009/0081881 A1 | 3/2009 | Kiyose | 438/753 |
| 2009/0179008 A1 | 7/2009 | Takahashi | 216/86 |
| 2009/0229641 A1 | 9/2009 | Yoshida | 137/107 |
| 2010/0095981 A1* | 4/2010 | Kamikawa | H01L 21/67028 134/3 |
| 2011/0143549 A1* | 6/2011 | Tange | C25B 1/22 438/745 |
| 2011/0220157 A1* | 9/2011 | Taira | H01L 21/02041 134/36 |
| 2012/0067847 A1 | 3/2012 | Sakurai et al. | 216/83 |
| 2012/0074102 A1 | 3/2012 | Magara et al. | 216/83 |
| 2012/0076936 A1 | 3/2012 | Hirano | 427/248.1 |
| 2013/0220478 A1 | 8/2013 | Kasahara et al. | 141/2 |
| 2013/0224956 A1 | 8/2013 | Negoro et al. | 438/697 |
| 2013/0255882 A1 | 10/2013 | Takahashi et al. | 156/345.15 |
| 2013/0306238 A1 | 11/2013 | Miura et al. | 156/345.11 |
| 2014/0045339 A1* | 2/2014 | Iwata | H01L 21/30604 438/745 |
| 2014/0231012 A1 | 8/2014 | Hinode et al. | 156/345.23 |
| 2014/0231013 A1 | 8/2014 | Hinode et al. | 156/345.23 |
| 2015/0053285 A1* | 2/2015 | Nakashima | G05D 7/0664 137/565.11 |
| 2015/0262811 A1* | 9/2015 | Ogawa | H01L 21/67017 205/723 |
| 2015/0273538 A1* | 10/2015 | Saiki | B08B 3/14 134/10 |
| 2015/0328668 A1* | 11/2015 | Koyama | B08B 9/032 134/22.12 |
| 2016/0093515 A1 | 3/2016 | Namba | 156/345.15 |

FOREIGN PATENT DOCUMENTS

| | | |
|---|---|---|
| CN | 103364478 A | 10/2013 |
| CN | 103426795 A | 12/2013 |
| JP | 2002-353186 A | 12/2002 |
| JP | 2005-079212 | 3/2005 |
| JP | 2006-237228 | 9/2006 |
| JP | 2007-088257 | 4/2007 |
| JP | 2007-258405 | 10/2007 |
| JP | 2008-034593 A | 2/2008 |
| JP | 2008-103678 | 5/2008 |
| JP | 2009-094455 | 4/2009 |
| JP | 2009-206419 | 9/2009 |
| JP | 2012-069696 | 4/2012 |
| JP | 2012-074601 | 4/2012 |
| JP | 2013-128063 A | 6/2013 |
| JP | 2013-197114 | 9/2013 |
| JP | 2013-206946 | 10/2013 |
| JP | 2014-157934 | 8/2014 |
| JP | 2014-157935 | 8/2014 |
| JP | 2014-157936 | 8/2014 |
| KR | 10-2008-0011910 A | 2/2008 |

* cited by examiner

SUBSTRATE PROCESSING APPARATUS

BACKGROUND OF THE INVENTION

Field of the Invention

The present invention relates to a substrate processing apparatus that performs various processing on a substrate.

Description of Related Art

Substrate processing apparatuses are conventionally used to subject substrates such as semiconductor wafers, glass substrates for photo masks, glass substrates for liquid crystal displays, glass substrates for plasma displays, substrates for optical discs, substrates for magnetic discs, substrates for magneto-optical discs, and other substrates to various types of processing. For example, in JP 2012-74601 A, a substrate processing apparatus that performs substrate processing using a chemical liquid such as a phosphoric acid aqueous solution is disclosed.

In the substrate processing apparatus described in JP 2012-74601 A, as shown in FIG. 10, a used processing liquid is collected and reused for substrate processing. The used processing liquid is collected by a cup and sent to a moisture evaporation unit. The moisture evaporation unit increases a temperature of the processing liquid to a temperature suitable for the substrate processing by heating the collected processing liquid. In this manner, the processing liquid in which the temperature is regulated is sent to a first tank from the moisture evaporation unit. The first tank supplies the processing liquid towards the processing unit.

BRIEF SUMMARY OF THE INVENTION

The processing liquid having a temperature considerably lower than the temperature suitable for the substrate processing flows into the moisture evaporation unit. Therefore, the moisture evaporation unit cannot replenish the first tank with the processing liquid concurrently with the processing liquid collection.

An object of the present invention is to provide a substrate processing apparatus capable of replenishing a supply tank with a processing liquid from a replenishment tank while collecting the processing liquid from a processing unit to the replenishment tank.

(1) A substrate processing apparatus according to one aspect of the present invention includes a processing unit including a processing liquid nozzle that supplies a processing liquid to a substrate, a supply tank that supplies the processing liquid to the processing liquid nozzle, first and second replenishment tanks for replenishing the supply tank with the processing liquid, a processing liquid collector connected to collect the processing liquid used in the processing unit and selectively supply the used processing liquid to the first and second replenishment tanks, a processing liquid replenisher connected to selectively replenish the supply tank with the processing liquid from the first and second replenishment tanks, a processing liquid circulator connected to selectively circulate the processing liquid in the first replenishment tank and the processing liquid in the second replenishment tank, a heater that heats the processing liquid passing through the processing liquid circulator, and a controller that controls the processing liquid replenisher such that the supply tank is replenished with the processing liquid in the second replenishment tank, and controls the processing liquid circulator such that the processing liquid in the first replenishment tank circulates while being heated by the heater, in a period in which the used processing liquid collected by the processing liquid collector is supplied to the first replenishment tank, and controls the processing liquid replenisher such that the supply tank is replenished with the processing liquid in the first replenishment tank, and controls the processing liquid circulator such that the processing liquid in the second replenishment tank circulates while being heated by the heater, in a period in which the used processing liquid collected by the processing liquid collector is supplied to the second replenishment tank.

In this substrate processing apparatus, the processing liquid is supplied from the supply tank to the processing liquid nozzle of the processing unit, and the processing liquid is supplied from the processing liquid nozzle to the substrate. The processing liquid used in the processing unit is collected by the processing liquid collector and is selectively supplied to the first and second replenishment tanks.

In a period in which the used processing liquid is supplied to the first replenishment tank, the supply tank is replenished with the processing liquid in the second replenishment tank by the processing liquid replenisher, and the processing liquid in the first replenishment tank is circulated by the processing liquid circulator while being heated by the heater. In a period in which the used processing liquid is supplied to the second replenishment tank, the supply tank is replenished with the processing liquid in the first replenishment tank by the processing liquid replenisher, and the processing liquid in the second replenishment tank is circulated by the processing liquid circulator while being heated by the heater.

This configuration causes the destination of supply of the used processing liquid collected by the processing liquid collector to be selectively switched between the first replenishment tank and the second replenishment tank. In this case, the used processing liquid can be continuously collected from the processing unit. Further, the supply tank is replenished with the processing liquid from the replenishment tank that is not being used for collection, concurrently with the collection of the used processing liquid.

The temperature of the used processing liquid is lower than the appropriate temperature (the temperature of the processing liquid used for the substrate processing), so that the temperature of the processing liquid in the replenishment tank being used for collection decreases. Even in such a case, the processing liquid is circulated by the processing liquid circulator while being heated by the heater. Thus, in a period in which the supply tank is replenished with the processing liquid from the replenishment tank that is not being used for collection, the temperature of the processing liquid in the replenishment tank being used for collection can be close to the appropriate temperature. As a result, the supply tank can be replenished with the processing liquid from the first or second replenishment tank while the processing liquid is collected from the processing unit to the first or second replenishment tank.

Further, in the above-mentioned configuration, the processing liquid in the first and second replenishment tanks can be selectively heated using the common heater. In this case, it is not necessary to provide the plurality of heaters respectively corresponding to the first and second replenishment tanks. Therefore, a reduction in cost of the substrate processing apparatus can be realized.

(2) The substrate processing apparatus may further includes a temperature regulator that regulates a temperature of the processing liquid passing through the processing liquid replenisher, wherein the processing liquid replenisher may include a replenisher circulator connected to be on standby for replenishing the supply tank with the processing liquid while circulating the processing liquid in the first and second replenishment tanks through the temperature regulator, and output of the temperature regulator may be lower than output of the heater.

In this case, the replenishment of the supply tank with the processing liquid can be on standby with the temperature of the processing liquid regulated by the temperature regulator being maintained. Further, because the output of the temperature regulator is lower than the output of the heater, a reduction in cost of the substrate processing apparatus can be realized.

(3) The replenishment circulator may be connected to selectively circulate the processing liquid in the first replenishment tank and the processing liquid in the second replenishment tank.

In this case, the replenishment of the supply tank with the processing liquid from the first and second replenishment tanks can be efficiently performed. Further, it is not necessary to provide a plurality of temperature regulators respectively corresponding to the first and second replenishment tanks. Therefore, a reduction in cost of the substrate processing apparatus can be realized.

(4) The controller may control the replenishment circulator such that the processing liquid in the first replenishment tank circulates while a temperature of the processing liquid in the first replenishment tank is regulated by the temperature regulator, in a period in which the used processing liquid collected by the processing liquid collector is supplied to the second replenishment tank, and may control the replenishment circulator such that the processing liquid in the second replenishment tank circulates while a temperature of the processing liquid in the second replenishment tank is regulated by the temperature regulator, in a period in which the used processing liquid collected by the processing liquid collector is supplied to the first replenishment tank.

In this case, the temperature of the processing liquid in the replenishment tank being used for collection can be maintained at the appropriate temperature, and the replenishment of the supply tank with the processing liquid can be on standby. Thus, the supply tank can be efficiently replenished with the processing liquid maintained at the appropriate temperature.

(5) The processing unit may include a cup that is provided to surround the substrate and catches the used processing liquid, the processing liquid collector may include a first collection pipe connected to the cup of the processing unit, second and third collection pipes respectively connected between the first collection pipe and each of the first and second replenishment tanks, and first and second collection valves respectively inserted into the second and third collection pipes, the processing liquid replenisher may include a first replenishment pipe connected to the supply tank, second and third replenishment pipes respectively connected between the first replenishment pipe and each of the first and second replenishment tanks, and the first and second replenishment valves respectively inserted into the second and third replenishment pipes, the processing liquid circulator may include first and second circulation pipes connected to the first replenishment tank, third and fourth circulation pipes connected to the second replenishment tank, a fifth circulation pipe that is connected between the first circulation pipe and the second circulation pipe and is connected between the third circulation pipe and the fourth circulation pipe, and first, second, third and fourth circulation valves respectively inserted into the first, second third and fourth circulation pipes, and the controller may open the second replenishment valve, the first circulation valve and the second circulation valve and may close the first replenishment valve, the third circulation valve and the fourth circulation valve in opening the first collection valve and closing the second collection valve, and may open the first replenishment valve, the third circulation valve and the fourth circulation valve and may close the second replenishment valve, the first circulation valve and the second circulation valve in opening the second collection valve and closing the first collection valve.

In this case, the processing liquid can be heated by the heater while the used processing liquid is collected to the replenishment tank with a simple control, and the supply tank can be replenished with the processing liquid from the other replenishment tank.

(6) The heater may be inserted into the fifth circulation pipe of the processing liquid circulator. In this case, the processing liquid in the first and second replenishment tanks can be selectively heated using the common heater with a simple configuration. Thus, realization of a reduction in cost of the substrate processing apparatus becomes easy.

(7) The temperature regulator may be inserted into the first replenishment pipe of the processing liquid replenisher. In this case, the temperature of the processing liquid in the first and second replenishment tanks can be selectively regulated using the common temperature regulator with a simple configuration. Thus, realization of a reduction in cost of the substrate processing apparatus becomes easy.

(8) The replenishment circulator may include fourth and fifth replenishment pipes respectively connected between the first replenishment pipe and each of the first and second replenishment tanks, and third and fourth replenishment valves respectively inserted into the fourth and fifth replenishment pipes, and the controller may open the fourth replenishment valve and may close the third replenishment valve in opening the first collection valve and closing the second collection valve, and may open the third replenishment valve and may close the fourth replenishment valve in opening the second collection valve and closing the first collection valve.

In this case, the temperature of the processing liquid in the replenishment tank being used for the collection can be maintained at an appropriate temperature with a simple control, and the replenishment of the supply tank with the processing liquid can be on standby.

(9) The substrate processing apparatus may further include each of first and second detection sensors that detects an amount of the processing liquid in each of the first and second replenishment tanks, wherein the controller may control the processing liquid collector to switch between a period in which the used processing liquid is supplied to the first replenishment tank and a period in which the used processing liquid is supplied to the second replenishment tank based on the amount of the processing liquid detected by each of the first and second detection sensors.

In this case, the used processing liquid can be appropriately collected to the first or second replenishment tank based on an amount of the processing liquid in each of the first and second replenishment tanks.

(10) The substrate processing apparatus may further include a new liquid supply device that supplies the processing liquid to the supply tank, the first replenishment tank or the second replenishment tank.

Even when the processing liquid that circulates in the substrate processing apparatus decreases, this configuration causes the processing liquid to be supplied to the supply tank, the first replenishment tank or the second replenishment tank. Thus, the substrate processing can be performed without depletion of the processing liquid.

Other features, elements, characteristics, and advantages of the present invention will become more apparent from the following description of preferred embodiments of the present invention with reference to the attached drawings.

DESCRIPTION OF THE PREFERRED EMBODIMENTS

A substrate processing apparatus according to one embodiment of the present invention will be described below with reference to drawings. In the following description, a substrate refers to a semiconductor wafer, a glass substrate for a liquid crystal display, a glass substrate for a PDP (Plasma Display Panel), a glass substrate for a photomask, a substrate for an optical disc and the like.

A substrate processing apparatus according to the present embodiment is a single-substrate processing apparatus that processes substrates one by one. In the substrate processing apparatus, a high temperature phosphoric acid aqueous solution ($H_3PO_4+H_2O$) is supplied as a processing liquid to a substrate on which a silicone oxide film made of silicon oxide ($SiO_2$) and a silicon nitride film made of silicon nitride ($Si_3N_4$) are formed, and the silicon nitride film is selectively etched.

Silicon is present in the processing liquid due to etching of the silicon nitride film by the phosphoric acid aqueous solution or mixing of a liquid concentrate including silicon particles in the phosphoric acid aqueous solution, for example.

(1) Configuration of Substrate Processing Apparatus

Figure 1:
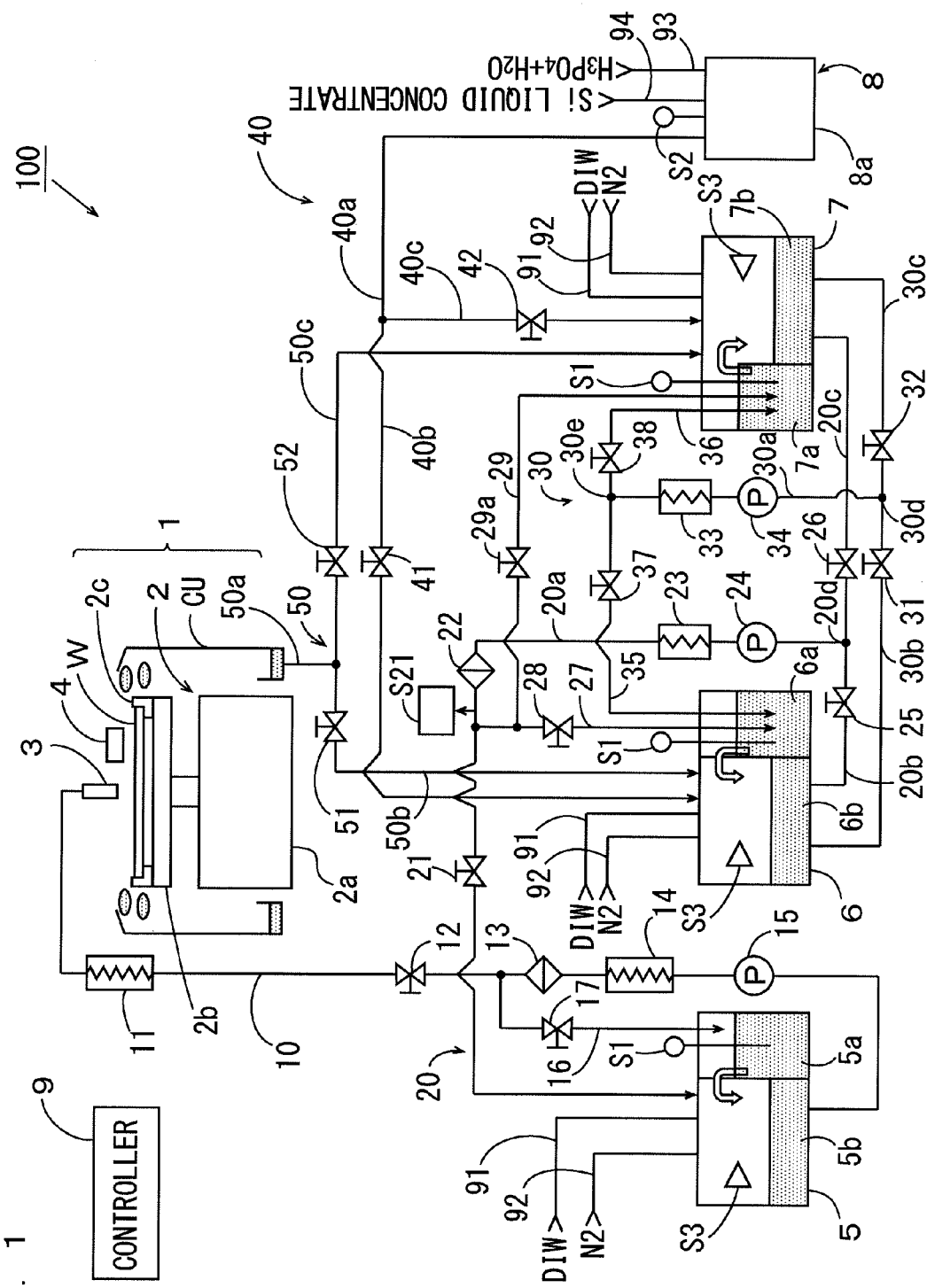
FIG. 1 is a schematic diagram showing a configuration of a substrate processing apparatus according to one embodiment of the present invention.

FIG. 1 is a schematic diagram showing the configuration of the substrate processing apparatus according to the one embodiment of the present invention. As shown in FIG. 1, the substrate processing apparatus 100 mainly includes a processor 1, a first tank 5, a second tank 6, a third tank 7, a new liquid supply device 8 and a controller 9. Further, the processor 1 includes a spin chuck 2, a processing liquid nozzle 3, a heating device 4 and a cup CU. In the processor 1, the plurality of substrates W are sequentially processed one by one.

The spin chuck 2 has a spin motor 2a, a spin base 2b and a plurality of chuck pins 2c. The spin motor 2a is provided such that a rotation shaft is parallel to a vertical direction. The spin base 2b has a disc shape and is attached to an upper end of the rotation shaft of the spin motor 2a in a horizontal attitude. The plurality of chuck pins 2c are provided on an upper surface of the spin base 2b and hold a peripheral edge of the substrate W. The spin motor 2a is operated with the plurality of chuck pins 2c holding the substrate W. Thus, the substrate W is rotated about a vertical axis.

While the mechanical spin chuck 2 holding the peripheral edge of the substrate W is used in the present example as described above, the invention is not limited to this. A suction-type spin chuck that holds a lower surface of the substrate W by suction may be used instead of the mechanical spin chuck 2.

The processing liquid nozzle 3 and the heating device 4 are provided to be movable between a position above the substrate W held by the spin chuck 2 and a waiting position beside the substrate W. The processing liquid nozzle 3 supplies the phosphoric acid aqueous solution (the processing liquid) supplied from the first tank 5 to the substrate W rotated by the spin chuck 2.

When the phosphoric acid aqueous solution is supplied from the processing liquid nozzle 3 to the substrate W, the heating device 4 is arranged at a position above the substrate W. The heating device 4 includes a lamp heater that generates infrared rays. The heating device 4 heats the phosphoric acid aqueous solution supplied to the substrate W and the upper surface of the substrate W by the heat of radiation and inhibits a decrease in temperature of the phosphoric acid aqueous solution on the substrate W. Thus, the temperature of the phosphoric acid aqueous solution on the substrate W is maintained at a temperature higher than a boiling point at the phosphoric acid concentration (about 170° C., for example), and an etching rate of the silicon nitride film by the phosphoric acid aqueous solution increases.

On the other hand, when the silicon concentration in the phosphoric acid aqueous solution is within an appropriate range, an etching rate of the silicone oxide film by the phosphoric acid aqueous solution is maintained sufficiently lower than an etching rate of the silicon nitride film. As a result, the silicon nitride film on the substrate W is selectively etched as described above.

The cup CU is provided to surround the spin chuck 2. The cup CU is lowered at a time of carrying of the substrate W into the spin chuck 2 and a time of carrying of the substrate W out from the spin chuck 2, and is lifted at a time of supply of the phosphoric acid aqueous solution to the substrate W.

At the time of supply of the phosphoric acid aqueous solution to the rotating substrate W, an upper end of the cup CU is located at a position further upward than the substrate W. Thus, the phosphoric acid aqueous solution being shaken off from the substrate W is caught by the cup CU. The phosphoric acid aqueous solution being caught by the cup CU is sent to the second tank 6 or the third tank 7 as described below. The first tank 5 includes a circulation tank 5a and a storage tank 5b. The circulation tank 5a and the storage tank 5b are arranged to be adjacent to each other, and are configured such that an overflowing liquid from one tank (the circulation tank 5a, for example) flows into the other tank (the storage tank 5b, for example). A phosphoric acid concentration meter S1 is provided in the circulation tank 5a. The phosphoric acid concentration meter S1 outputs the phosphoric acid concentration of the phosphoric acid aqueous solution. In the storage tank 5b, a liquid surface sensor S3 that outputs a height of a liquid surface of the phosphoric acid aqueous solution is provided. A DIW (Deionized Water) supply system 91 and a nitrogen ($N_2$) gas supply system 92 are connected to the storage tank 5b.

A first supply pipe 10 is provided to connect the storage tank 5b of the first tank 5 to the processing liquid nozzle 3 of the processor 1. A pump 15, a heater 14, a filter 13, a valve 12 and a heater 11 are inserted into the first supply pipe 10 in this order from the storage tank 5b towards the processing liquid nozzle 3.

A circulation pipe 16 is provided to connect a portion, of the first supply pipe 10, that is located between the filter 13 and the valve 12 to the circulation tank 5a. A valve 17 is inserted into the circulation pipe 16.

Similarly to the first bank 5, the second tank 6 has a circulation tank 6a and a storage tank 6b, and the third tank 7 has a circulation tank 7a and a storage tank 7b. In each of the circulation tanks 6a, 7a, the phosphoric acid concentration meter S1 is provided. The liquid surface meter S3 is provided in each of the storage tanks 6b, 7b, and the DIW supply system 91 and a nitrogen gas supply system 92 are connected to each of the storage tanks 6b, 7b.

A processing liquid replenishment system 20 is provided to connect the storage tank 5b of the first tank 5 to each of the storage tanks 6b, 7b of the second and third tanks 6, 7. The processing liquid replenishment system 20 is a supply system for alternately replenishing the first tank 5 with the processing liquids stored in the second and third tanks 6, 7 and is used by being switched between the second tank 6 and the third tank 7. The processing liquid replenishment system 20 has one main pipe 20a and two branch pipes 20b, 20c.

The main pipe 20a is connected to the storage tank 5b of the first tank 5 and is connected to each of the branch pipes 20b, 20c at a nodal point 20d. The one branch pipe 20b is connected to the storage tank 6b of the second tank 6, and the other branch pipe 20c is connected to the storage tank 7b of the third tank 7.

A valve 21, a silicon concentration meter S21, a filter 22, a heater 23 and a pump 24 are inserted into the main pipe 20a in this order from the first tank 5 towards the nodal point 20d. The silicon concentration meter S21 samples the phosphoric acid aqueous solution that flows in the main pipe 20a and intermittently detects the silicon concentration of the phosphoric acid aqueous solution.

A valve 25 is inserted into the one branch pipe 20b. A valve 26 is inserted into the other branch pipe 20c. A circulation pipe 27 is provided to connect a portion of the main pipe 20a between the filter 22 and the valve 21 to the circulation tank 6a. A valve 28 is inserted into the circulation pipe 27. The circulation pipe 29 is branched out from the circulation pipe 27. The circulation pipe 29 is coupled to the circulation tank 7a. A valve 29a is inserted into the circulation pipe 29.

A processing liquid circulation system 30 having a function of recirculating the processing liquid in the storage tank 6b of the second tank 6 to the circulation tank 6a and a function of recirculating the processing liquid in the storage tank 7b of the third tank 7 to the circulation tank 7a is provided. The processing liquid circulation system 30 is used by being switched between the second tank 6 and the third tank 7.

The processing liquid circulation system 30 has a main pipe 30a and two branch pipes 30b, 30c. The main pipe 30a is connected to the two branch pipes 30b, 30c at a nodal point 30d. The one branch pipe 30b is provided between the storage tank 6b of the second tank 6 and the nodal point 30d, and the other branch pipe 30c is provided between the storage tank 7b of the third tank 7 and the nodal point 30d. A valve 31 is inserted into the one branch pipe 30b, and a valve 32 is inserted into the other branch pipe 30c.

The main pipe 30a is connected to a circulation pipe 35 directed towards the circulation tank 6a of the second tank 6 at a nodal point 30e and is connected to a circulation pipe 36 directed towards the circulation tank 7a of the third tank 7. A valve 37 is inserted into the one circulation pipe 35, and a valve 38 is inserted into the other circulation pipe 36. A pump 34 and a heater 33 are inserted into the main pipe 30a in this order from the nodal point 30d towards the nodal point 30e.

A collection pipe 50 is provided to connect the cup CU of the processor 1 to each of the storage tank 6b of the second tank 6 and the storage tank 7b of the third tank 7. The collection pipe 50 has one main pipe 50a and two branch pipes 50b, 50c. The branch pipes 50b, 50c are connected to the main pipe 50a. The main pipe 50a of the collection pipe 50 is connected to the cup CU, the branch pipe 50b is connected to the storage tank 6b of the second tank 6, and the branch pipe 50c is connected to the storage tank 7b of the third tank 7. A valve 51 is inserted into the branch pipe 50b, and a valve 52 is inserted into the branch pipe 50c.

The new liquid supply device 8 has a mixture tank 8a. Further, the new liquid supply device 8 has a supply device (not shown) that supplies a liquid in the mixture tank 8a to outside. A phosphoric acid aqueous solution supply system 93 and a silicon (Si) liquid concentrate supply system 94 are connected to the new liquid supply device 8. Further, a silicon concentration meter S2 is provided in the mixture tank 8a.

The phosphoric acid aqueous solution supplied from the phosphoric acid aqueous solution supply system 93 and the silicon liquid concentrate supplied from the silicon liquid concentrate supply system 94 are mixed in the mixture tank 8a of the new liquid supply device 8 at a predetermined ratio. Thus, the phosphoric acid aqueous solution having predetermined silicon concentration (hereinafter referred to as reference silicon concentration) is produced as a new processing liquid and is maintained at a predetermined temperature.

A second supply pipe 40 is provided to connect the new liquid supply device 8 to each of the storage tank 6b of the second tank 6 and the storage tank 7b of the third tank 7. The second supply pipe 40 has one main pipe 40a and two branch pipes 40b, 40c. The branch pipes 40b, 40c are connected to the main pipe 40a. The main pipe 40a of the second supply pipe 40 is connected to the new liquid supply device 8, the branch pipe 40b is connected to the storage tank 6b of the second tank 6, and the branch pipe 40c is connected to the storage tank 7b of the third tank 7. A valve 41 is inserted into the branch pipe 40b, and a valve 42 is inserted into the branch pipe 40c. The new processing liquid mixed in the new liquid supply device 8 may be supplied from the new liquid supply device 8 to the first tank 5.

The controller 9 is constituted by a CPU (Central Processing Unit) and a memory, a microcomputer or the like. A system program is stored in the memory of the controller 9. The controller 9 controls an operation of each constituent element of the substrate processing apparatus 100.

For example, the controller 9 switches between open and close states of each valve 12, 17, 21, 26, 31, 36, 41, 42, 51, 52 based on the height of the liquid surface output from each liquid surface sensor S3. Further, the controller 9 controls the DIW supply system 91 and the nitrogen gas supply system 92 based on the phosphoric acid concentration output from each phosphoric acid concentration meter S1.

(2) Operation of Substrate Processing Apparatus

Figure 2:
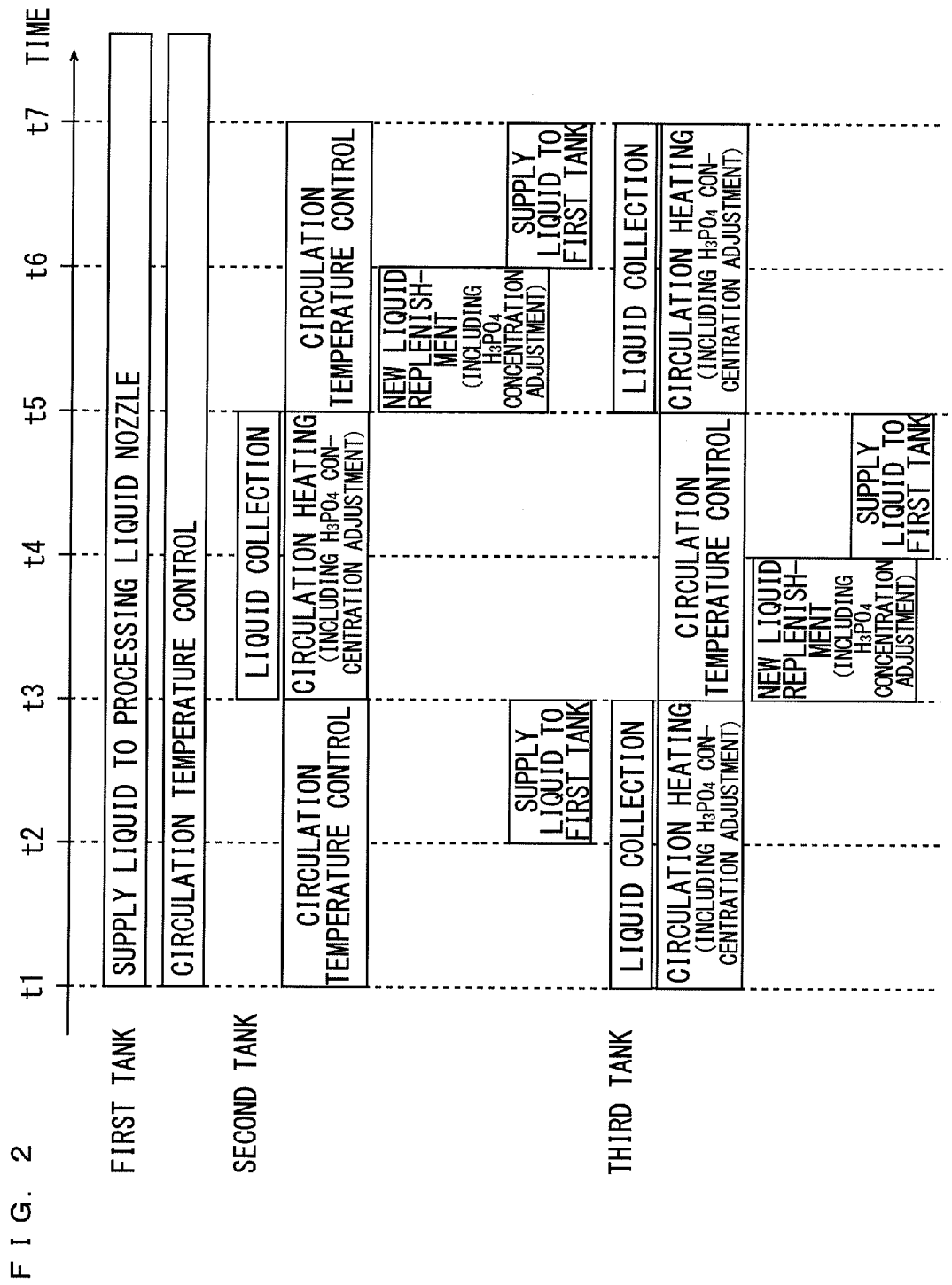
FIG. 2 is a time chart showing contents of operations respectively related to first, second and third tanks of FIG. 1.

A series of operations of the substrate processing apparatus 100 of when the plurality of substrates W are processed by the processor 1 will be described. FIG. 2 is a time chart showing the contents of the operations respectively related to the first, second and third tanks 5, 6, 7 of FIG. 1. FIGS. 3 to 8 are schematic diagrams showing the operations of the substrate processing apparatus 100 at each time point.

In the first, second and third tanks 5, 6, 7, a first reference height L1 and a second reference height L2 are respectively set in each of the storage tanks 5b, 6b, 7b. The first reference height L1 is set in the vicinity of a bottom portion of each of the storage tanks 5b, 6b, 7b. The second reference height L2 is higher than the first reference height L1 and is set in the vicinity of the upper end of each of the storage tanks 5b, 6b, 7b.

The first reference height L1 is set to the height of the liquid surface of when about one fifth of the liquid of the maximum capacity that can be stored by each storage tank 5b, 6b, 7b is stored in each storage tank 5b, 6b, 7b, for example. The second reference height L2 is set to the height of the liquid surface of when the liquid of four fifth of the maximum capacity of each storage tank 5b, 6b, 7b is stored in each storage tank 5b, 6b, 7b, for example.

In the initial state, the phosphoric acid aqueous solution having predetermined phosphoric acid concentration (hereinafter referred to as reference phosphoric acid concentration) and the reference silicon concentration is stored in the first, second and third tanks 5, 6, 7. In each of the first, second and third tanks 5, 6, 7, the height of the liquid surface of the phosphoric acid aqueous solution is maintained at the second reference height L2. At a time point shown in FIG. 3, the phosphoric acid aqueous solution is stored in the third tank 7 to the first reference height L1.

Further, in the initial state, the heaters 14, 23, 33 are energized, and the valves 17, 25, 28, 32, 38 are opened. Thus, in the first tank 5, as indicated by a thick arrow A1 in FIG. 3, the phosphoric acid aqueous solution in the storage tank 5b is sucked by the pump 15 and sent to the filter 13 through the heater 14. The heater 14 heats the phosphoric acid aqueous solution passing through the first supply pipe 10 to a predetermined temperature (150° C., for example). The filter 13 removes unnecessary deposits and the like by filtering the phosphoric acid aqueous solution.

Figure 3:
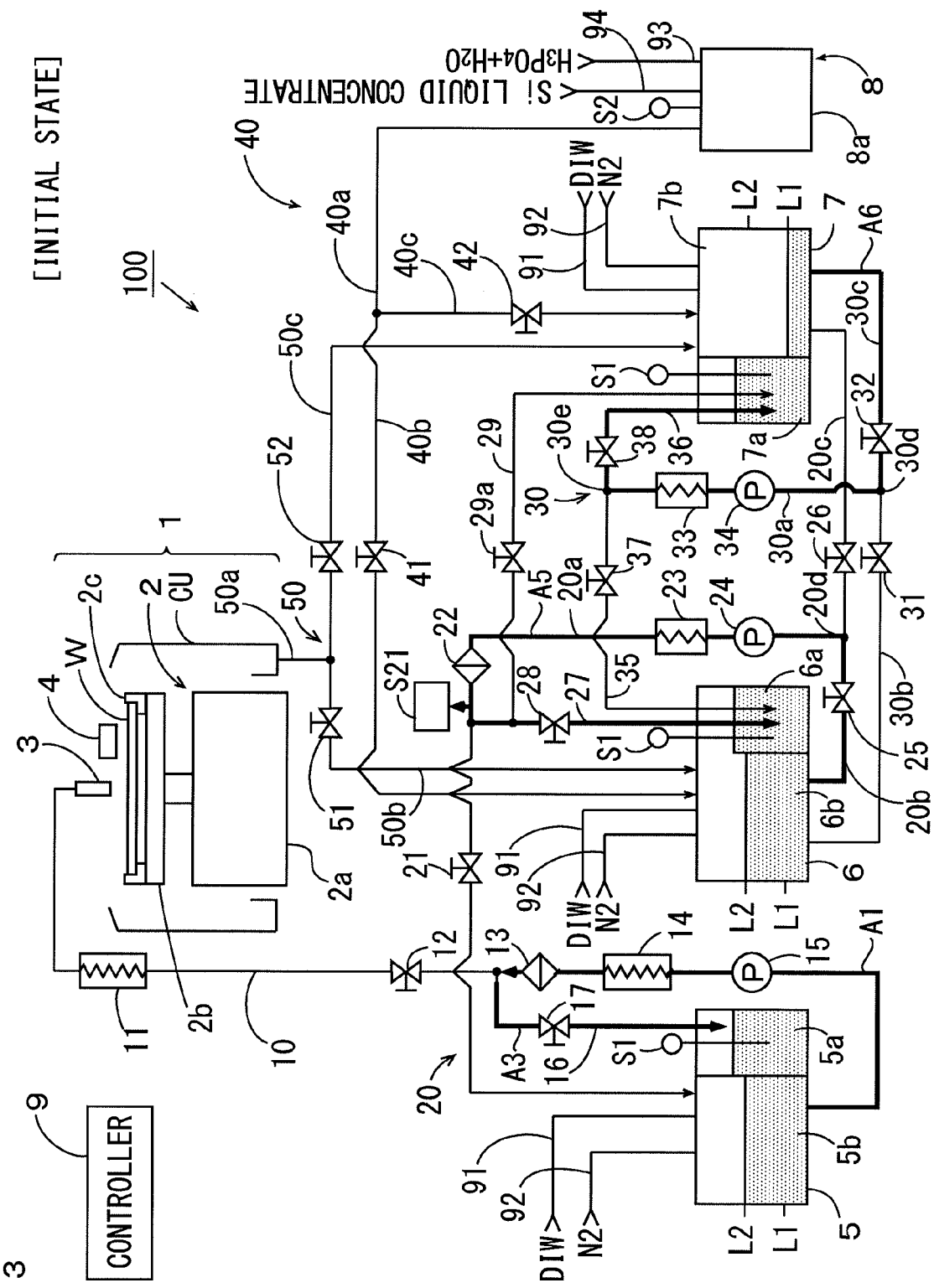
FIG. 3 is a schematic diagram showing an operation of the substrate processing apparatus in an initial state.
Figure 4:
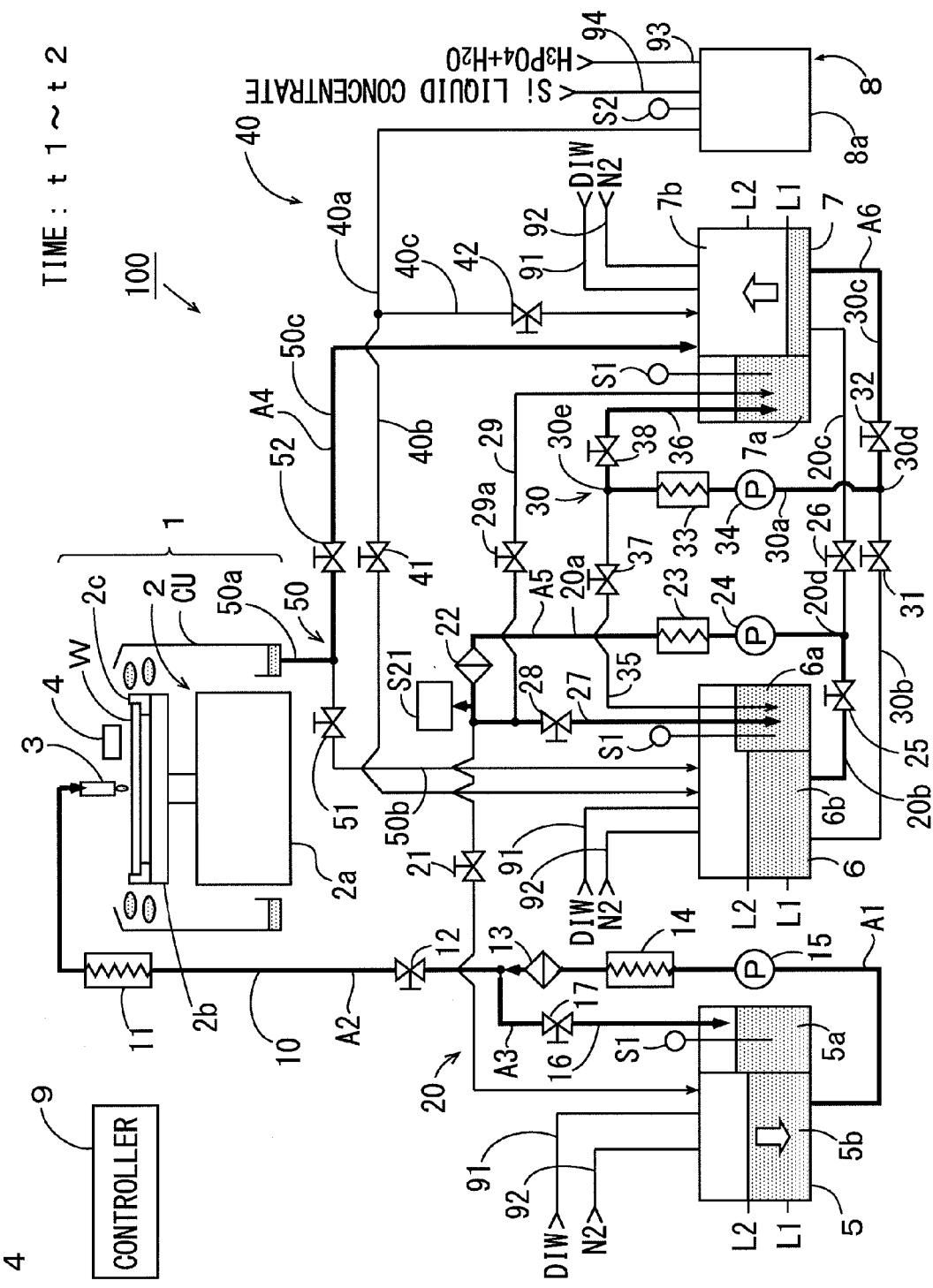
FIG. 4 is a schematic diagram showing the operation of the substrate processing apparatus from a time point t1 to a time point t2 of FIG. 2.
Figure 5:
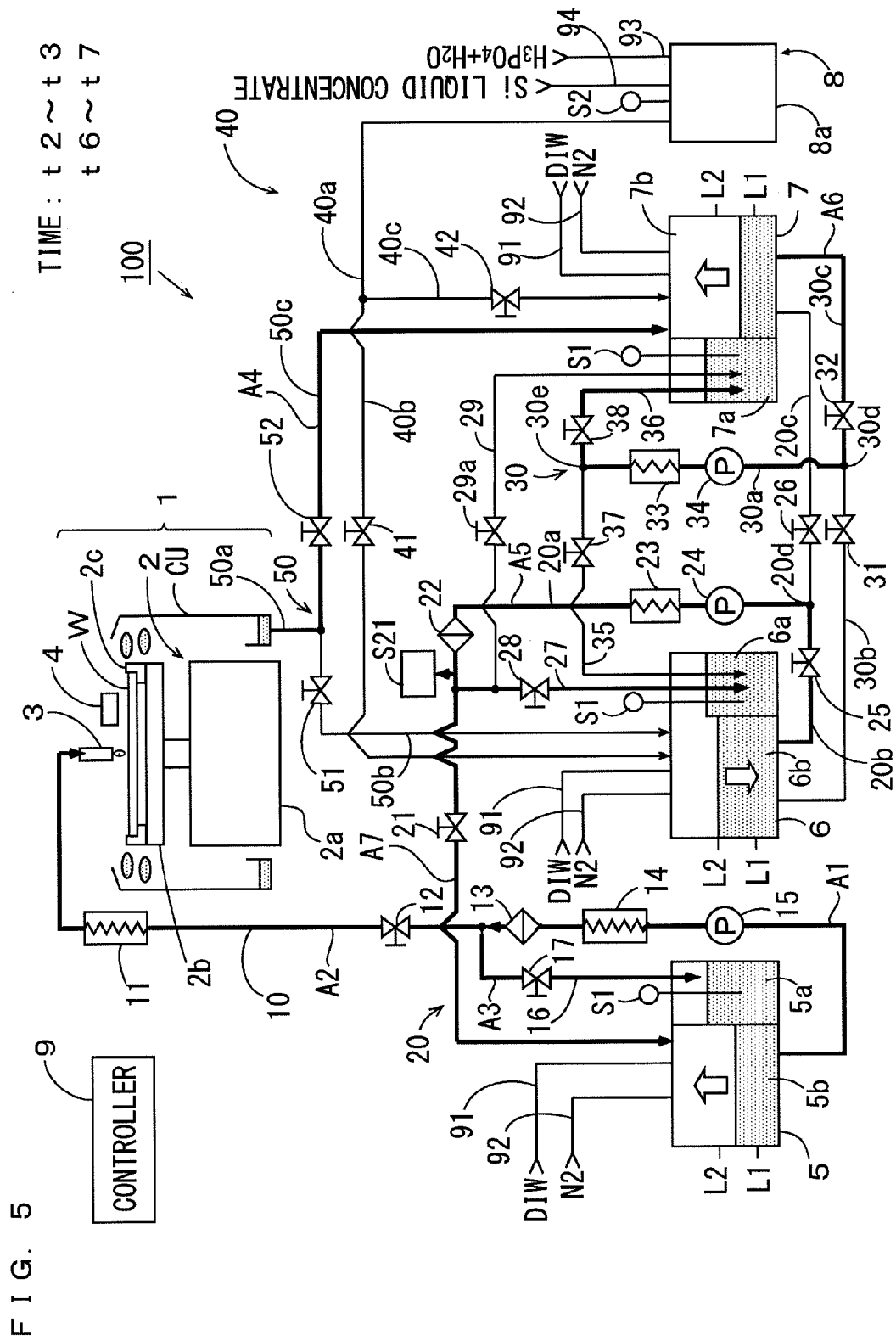
FIG. 5 is a schematic diagram showing an operation of the substrate processing apparatus from the time point t2 to a time point t3 and a time point t6 to a time point t7 of FIG. 2.

As indicated by a thick arrow A3 in FIG. 3, the phosphoric acid aqueous solution that has passed through the heater 14 and the filter 13 is returned to the circulation tank 5a of the first tank 5 through the circulation pipe 16. In the first tank 5, the phosphoric acid aqueous solution overflowing from the circulation tank 5a flows into the storage tank 5b. In this manner, the phosphoric acid aqueous solution in the storage tank 5b passes through one portion of the first supply pipe 10, the circulation pipe 16 and the circulation tank 5a while being heated and filtered to be returned to the storage tank 5b. Thus, the temperature and cleanliness of the phosphoric acid aqueous solution in the storage tank 5b is maintained substantially constant.

As described above, an operation of maintaining the temperature and cleanliness of the phosphoric acid aqueous solution in the storage tank 5b by returning part of the phosphoric acid aqueous solution stored in the storage tank 5b while heating and filtering it is referred to as circulation temperature control.

Similarly, the circulation temperature control is performed in the second tank 6. That is, as indicated by a thick arrow A5 in FIG. 3, the phosphoric acid aqueous solution in the storage tank 6b passes through the heater 23 and the filter 22 and circulated to the circulation tank 6a after being sucked by the pump 24.

In the third tank 7, as indicated by a thick arrow A6 in FIG. 3, the phosphoric acid aqueous solution in the storage tank 7b is sucked by the pump 34 and returned to the circulation tank 7a after passing through the heater 33 and heated to a predetermined temperature.

At a time point t1, the first substrate W is carried into the spin chuck 2 of the processor 1. Further, the substrate W is held and rotated by the spin chuck 2. The controller 9 opens the valve 12 of FIG. 1. Thus, as indicated by a thick arrow A2 in FIG. 4, the phosphoric acid aqueous solution sucked from inside of the storage tank 5b by the pump 15 is sent to the processing liquid nozzle 3 while passing through the heaters 14, 11 and being heated to a temperature suitable for the substrate processing (170° C., for example). Thus, the phosphoric acid aqueous solution having the reference phosphoric acid concentration and the reference silicon concentration is supplied to the substrate W from the processing liquid nozzle 3.

The controller 9 further opens the valve 52 of FIG. 1. Thus, as indicated by a thick arrow A4 in FIG. 4, the used phosphoric acid aqueous solution collected by the cup CU of the processor 1 is sent to the storage tank 7b of the third tank 7 through the main pipe 50a and the branch pipe 50c. The temperature of the used phosphoric acid aqueous solution collected through the main pipe 50a (120° C., for example) is considerably lower than the temperature of the phosphoric acid aqueous solution supplied from the processing liquid nozzle 3 (about 170° C., for example). In this manner, an operation of sending the used low-temperature phosphoric acid aqueous solution collected from the substrate W to the storage tank 7b is referred to as liquid collection.

At the time point t1, the valves 25, 28 of the processing liquid replenishment system 20 of FIG. 1 are opened. Thus, as indicated by the thick arrow A5 in FIG. 4, the circulation temperature control similar to the first tank 5 is also performed in the second tank 6.

Further, the valves 32, 38 of the processing liquid circulation system 30 are opened. Thus, as indicated by the thick arrow A6 in FIG. 4, the phosphoric acid aqueous solution stored in the storage tank 7b of the third tank 7 passes through part of the processing liquid circulation system 30, that is, the branch pipe 30c, the main pipe 30a the pump 34, the heater 33 and the circulation pipe 36 to be recirculated to the circulation tank 7a. The heater 33 of the processing liquid circulation system 30 has output higher than the heater 23 inserted into the processing liquid replenishment system 20 and has ability to rapidly increase the temperature of the used phosphoric acid aqueous solution that has a temperature considerably lower than the temperature suitable for the substrate processing. In this manner, an operation of rapidly increasing the temperature of the phosphoric acid aqueous solution stored in the third tank 7 by returning part of the phosphoric acid aqueous solution stored in the storage tank 7b to the circulation tank 7a while heating it is referred to as circulation heating.

When the liquid collection and circulation heating are performed in the third tank 7, the phosphoric acid concentration of the phosphoric acid aqueous solution stored in the storage tank 7b is different from the reference phosphoric acid concentration. The controller 9 of FIG. 1 controls the DIW supply system 91 and the nitrogen gas supply system 92 such that the phosphoric acid concentration in the storage tank 7b is close to the reference phosphoric acid concentration based on the output of the phosphoric acid concentration meter S1 of the third tank 7.

For example, the controller 9 controls the DIW supply system 91 to supply the DIW to the storage tank 7b when the output from the phosphoric acid concentration meter S1 is higher than the reference phosphoric acid concentration. Thus, the phosphoric acid concentration in the storage tank 7b decreases and is adjusted to the reference phosphoric acid concentration. The controller 9 controls the nitrogen gas supply system 92 to supply the nitrogen gas to the storage tank 7b when the output from the phosphoric acid concentration meter S1 is lower than the reference phosphoric acid concentration. In this case, evaporation of the phosphoric acid aqueous solution in the storage tank 7b is promoted. Thus, the phosphoric acid concentration in the storage tank 7b increases and is adjusted to the reference phosphoric acid concentration. In this manner, an operation of adjusting the phosphoric acid concentration of the phosphoric acid aqueous solution in the storage tank 7b to the reference phosphoric acid concentration is referred to as phosphoric acid concentration adjustment.

As shown in FIG. 2, from the time point t1 to a time point t2, the supply of the phosphoric acid aqueous solution to the processing liquid nozzle 3 and the circulation temperature control are performed in the first tank 5. In the second tank 6, the circulation temperature control is performed. In the third tank 7, the liquid collection, the circulation heating and the phosphoric acid concentration adjustment are performed. Thus, from the time point t1 to the time point t2, as indicated by outlined arrows in FIG. 4, the height of the liquid surface in the storage tank 5b is lowered from the second reference height L2, the height of the liquid surface in the storage tank 6b is maintained at the second reference height L2, and the height of the liquid surface in the storage tank 7b is lifted from the first reference height L1. Further, the temperature of the phosphoric acid aqueous solution in the third tank 7 is rapidly increased by the heater 33.

The supply of the phosphoric acid aqueous solution from the first tank 5 to the processing liquid nozzle 3 is continued until the processing for the substrate W in the processor 1 is finished. Further, the circulation temperature control in the first tank 5 is continued at least until the processing for the substrate W is finished. In the second tank 6 and the third tank 7, the circulation temperature control and the circulation heating are alternately performed at least until the processing for the substrate W is finished.

When it is detected by the liquid surface sensor S3 that the height of the liquid surface in the storage tank 5b of the first tank 5 is lower than the second reference height L2, the controller 9 of FIG. 1 opens the valve 21 of FIG. 1 (the time point t2).

Thus, the supply of the phosphoric acid aqueous solution from the second tank 6 to the first tank 5 is started. As indicated by a thick arrow A7 in FIG. 5, part of the phosphoric acid aqueous solution that has passed through the branch pipe 20b and the filter 22 from the storage tank 6b of the second tank 6 is sent to the storage tank 5b of the first tank 5 through the main pipe 20a. In this manner, the phosphoric acid aqueous solution having the reference phosphoric acid concentration and the reference silicon concentration is supplied from the second tank 6 to the first tank 5. Thus, the height of the liquid surface in the storage tank 5b is lifted towards the second reference height L2, and the height of the liquid surface in the storage tank 6b is lowered from the second reference height L2 (see an outlined arrow in FIG. 5).

When it is detected by the liquid surface sensor S3 that the height of the liquid surface in the storage tank 5b of the first tank 5 reaches the second reference height L2, the controller 9 of FIG. 1 closes the valve 21 of FIG. 1 and stops the supply of the phosphoric acid aqueous solution from the second tank 6 to the first tank 5 (a time point t3).

While the phosphoric acid aqueous solution is supplied from the second tank 6 to the first tank 5 from the time point t2 to the time point t3, the liquid collection and the phosphoric acid concentration adjustment are performed in the third tank 7 concurrently with this. Thus, the height of the liquid surface in the storage tank 7b of the third tank 7 is lifted from the first reference height L1.

When the supply of the phosphoric acid aqueous solution from the second tank 6 to the first tank 5 is stopped at the time point t3, destination of collection of the used phosphoric acid aqueous solution is switched from the third tank 7 to the second tank 6. That is, the controller 9 closes the valve 52 and opens the valve 51, of FIG. 1. Thus, the used phosphoric acid aqueous solution that has been collected by the cup CU of the processor 1 is sent to the storage tank 6b of the second tank 6 (see a thick arrow A8 of FIG. 6).

Further, switching of the circulation paths of the phosphoric acid aqueous solution in the second and third tanks 6, 7 is performed in accordance with this switch. That is, the controller 9 closes the valves 32, 38 of the processing liquid circulation system 30 of FIG. 1 and opens the valves 31, 37. Thus, the circulation path of the phosphoric acid aqueous solution in the second tank 6 is switched from the processing liquid replenishment system 20 to the processing liquid circulation system 30. Further, the controller 9 closes the valves 25, 28 of the processing liquid replenishment system 20 of FIG. 1 and opens the valves 26, 29a. Thus, the circulation path of the phosphoric acid aqueous solution in the third tank 7 is switched from the processing liquid circulation system 30 to the processing liquid replenishment system 20.

The circulation path of the phosphoric acid aqueous solution in the second tank 6 is switched to the processing liquid circulation system 30 that passes through the heater 33, so that the temperature the phosphoric acid aqueous solution collected to the second tank 6 can be rapidly increased by the heater 33.

In the single-substrate processing apparatus, part of the processing liquid is discarded by rinsing processing and the like. Therefore, all of the processing liquid used for the processing for the substrate W cannot be collected. Therefore, even when the height of the liquid surface in the storage tank 6b is lowered from the second reference height L2 to the first reference height L1 with the height of the liquid surface in the storage tank 5b being maintained at the second reference height L2, the height of the liquid surface in the storage tank 7b is not lifted from the first reference height L1 to the second reference height L2. The controller 9 of FIG. 1 controls the valve 42 and the new liquid supply device 8 of FIG. 1 such that the height of the liquid surface in the storage tank 7b is lifted to the second reference height L2.

For example, the controller 9 opens the valve 42 of FIG. 1. Thus, as indicated by a thick arrow A9 in FIG. 6, the new liquid of the phosphoric acid aqueous solution is supplied from the new liquid supply device 8 to the third tank 7. As a result, the height of the liquid surface in the storage tank 7b is lifted to the second reference height L2. Such supply of the new liquid from the new liquid supply device 8 to the storage tank 6b or the storage tank 7b is referred to as new liquid replenishment.

When it is detected by the liquid surface sensor S3 that the new liquid of the phosphoric acid aqueous solution is stored in the storage tank 7b of the third tank 7 to the second reference height L2, the controller 9 stops the supply of the phosphoric acid aqueous solution from the new liquid supply device 8 to the third tank 7 and finishes the new liquid replenishment to the third tank 7 (a time point t4).

Figure 6:
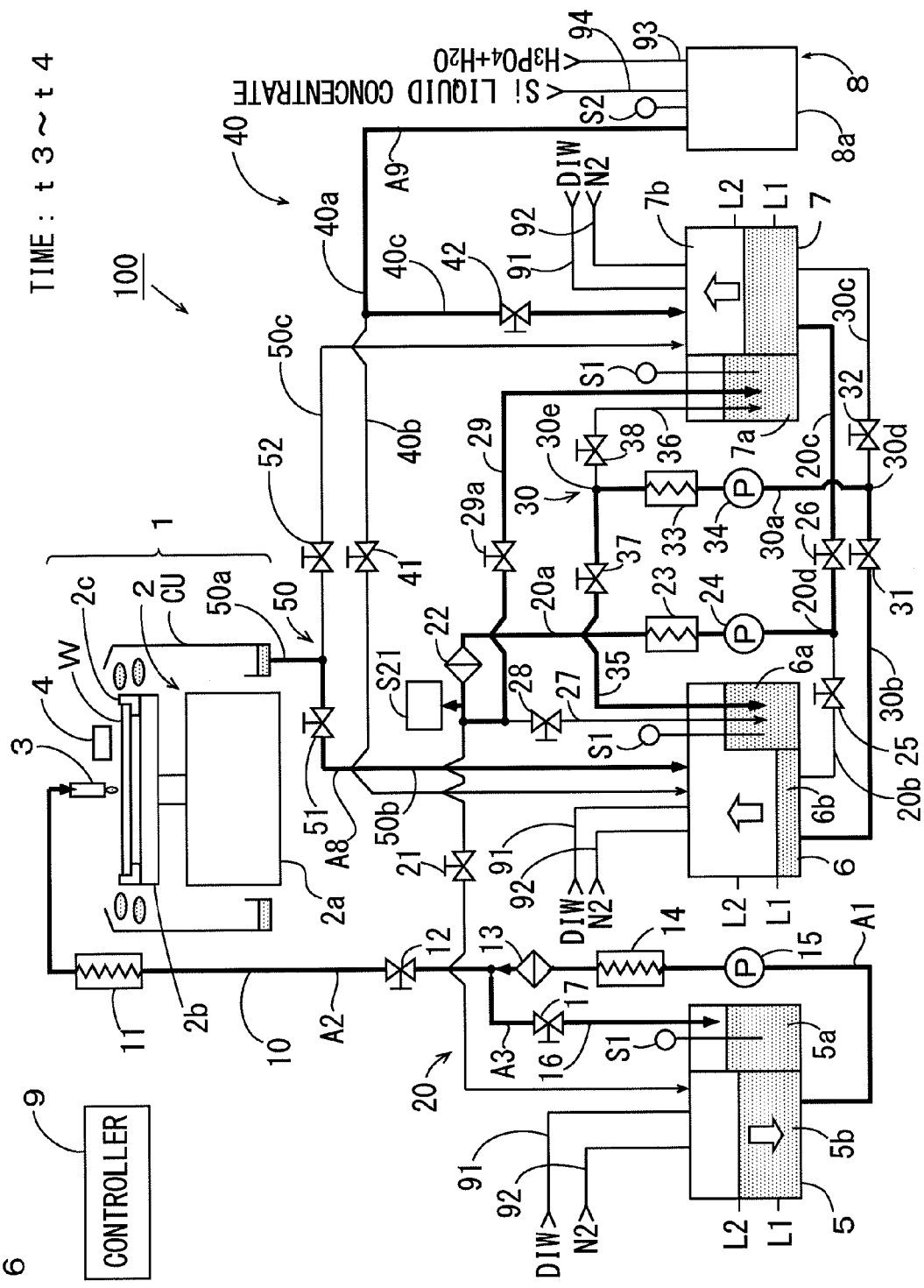
FIG. 6 is a schematic diagram showing an operation of the substrate processing apparatus from the time point t3 to a time point t4 of FIG. 2.

As shown in FIGS. 2 and 6, the supply of the phosphoric acid aqueous solution from the first tank 5 to the processor 1 is continued from the time point t3 to the time point t4, so that the height of the liquid surface in the storage tank 5b is lowered from the second reference height L2. Further, the liquid collection is continued in the second tank 6, so that the height of the liquid surface in the storage tank 6b is lifted from the first reference height L1.

Figure 7:
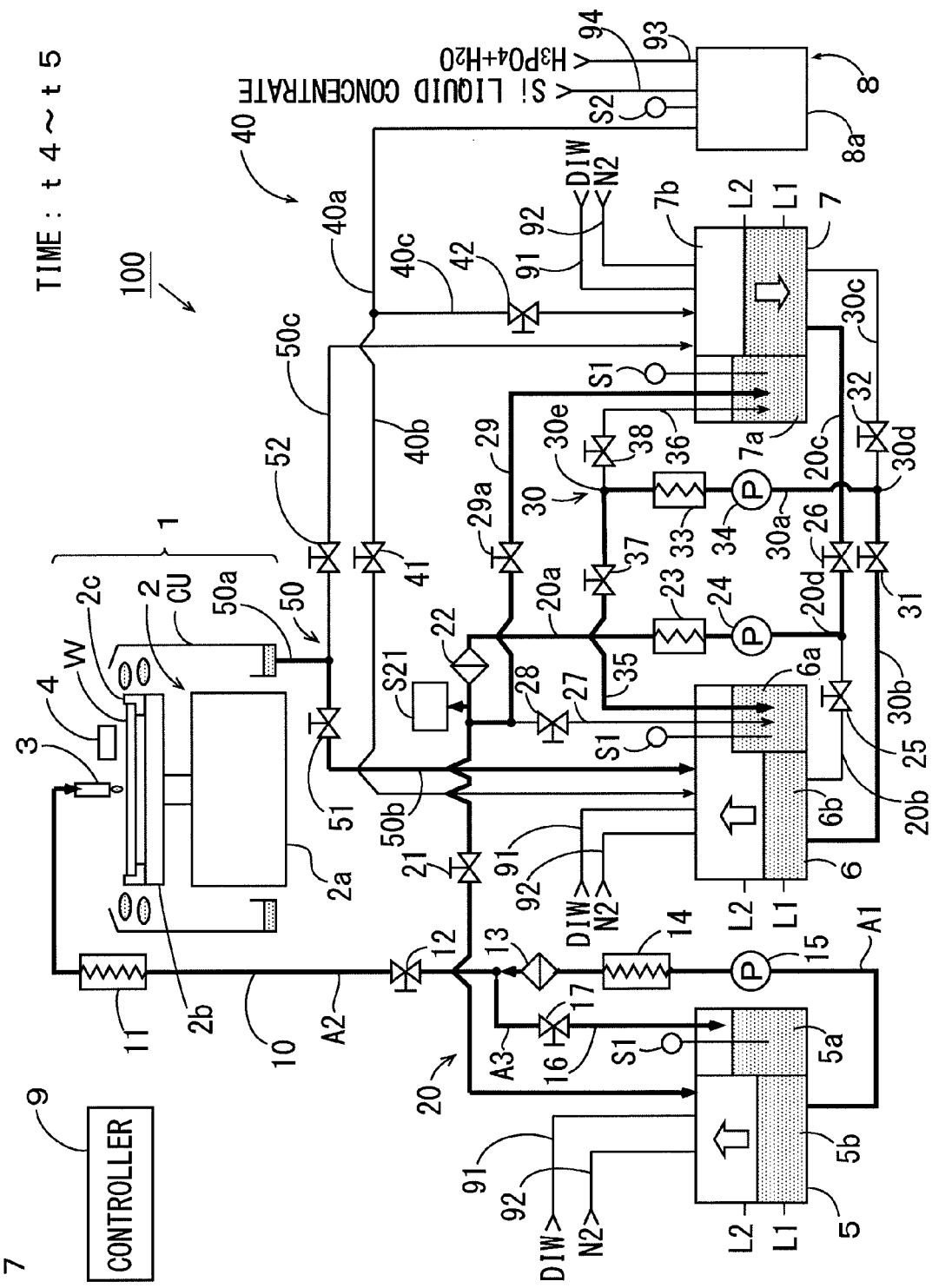
FIG. 7 is a schematic diagram showing an operation of the substrate processing apparatus from the time point t4 to a time point t5 of FIG. 2.

When it reaches the time point t4, the controller 9 opens the valve 21 and starts to supply the phosphoric acid aqueous solution having the reference phosphoric acid concentration and the reference silicon concentration from the third tank 7 towards the first tank 5. Thus, as shown in FIG. 7, the height of the liquid surface in the storage tank 5b of the first tank 5 is lifted towards the second reference height L2.

When it is detected that the height of the liquid surface of the first tank 5 is equal to the second reference height L2, the controller 9 stops the supply of the phosphoric acid aqueous solution from the third tank 7 to the first tank 5 (a time point t5). The height of the liquid surface in the storage tank 6b is lifted by the liquid collection in the second tank 6.

When the supply of the phosphoric acid aqueous solution from the third tank 7 to the first tank 5 is stopped at the time point t5, the destination of collection of the used phosphoric acid aqueous solution is switched from the second tank 6 to the third tank 7. That is, the controller 9 closes the valve 51 and opens the valve 52 of FIG. 1. Thus, the used phosphoric acid aqueous solution collected by the cup CU of the processor 1 is sent to the storage tank 7b of the third tank 7 (see the thick arrow A4 in FIG. 8).

Further, switching of the circulation paths of the phosphoric acid aqueous solution in the second and third tanks 6, 7 is performed in accordance with this switch. That is, the controller 9 closes the valves 26, 29a of the processing liquid replenishment system 20 and opens the valves 25, 28 of FIG. 1. Thus, the circulation path of the phosphoric acid aqueous solution in the second tank 6 is switched from the processing liquid circulation system 30 to the processing liquid replenishment system 20.

Further, the controller 9 closes the valves 31, 37 of the processing liquid circulation system 30 and opens the valves 32, 38 of FIG. 1. Thus, the circulation path of the phosphoric acid aqueous solution in the third tank 7 is switched from the processing liquid replenishment system 20 to the processing liquid circulation system 30.

The circulation path of the phosphoric acid aqueous solution in the third tank 7 is switched to the processing liquid circulation system 30 that passes through the heater 33, so that the temperature of the phosphoric acid aqueous solution collected to the third tank 7 can be rapidly increased by the heater 33. In the third tank 7, the phosphoric acid concentration adjustment is performed concurrently with the liquid collection.

Further, from the time point t5, the new liquid replenishment for the second tank 6 is started. That is, the controller 9 opens the valve 41 and controls the new liquid supply device 8 of FIG. 1. Thus, as indicated by a thick arrow A11 in FIG. 8, the new liquid of the phosphoric acid aqueous solution in which the silicon concentration is adjusted is supplied from the new liquid supply device 8 to the second tank 6, and the silicon concentration of the phosphoric acid aqueous solution in the storage tank 6b is maintained at the reference silicon concentration.

When it is detected by the liquid surface sensor S3 that the phosphoric acid aqueous solution having the reference phosphoric acid concentration and the reference silicon concentration is stored in the storage tank 6b of the second tank 6 to the second reference height L2, the controller 9 stops the supply of the phosphoric acid aqueous solution from the new liquid supply device 8 to the second tank 6 and finishes the new liquid replenishment for the second tank 6 (a time point t6).

Figure 8:
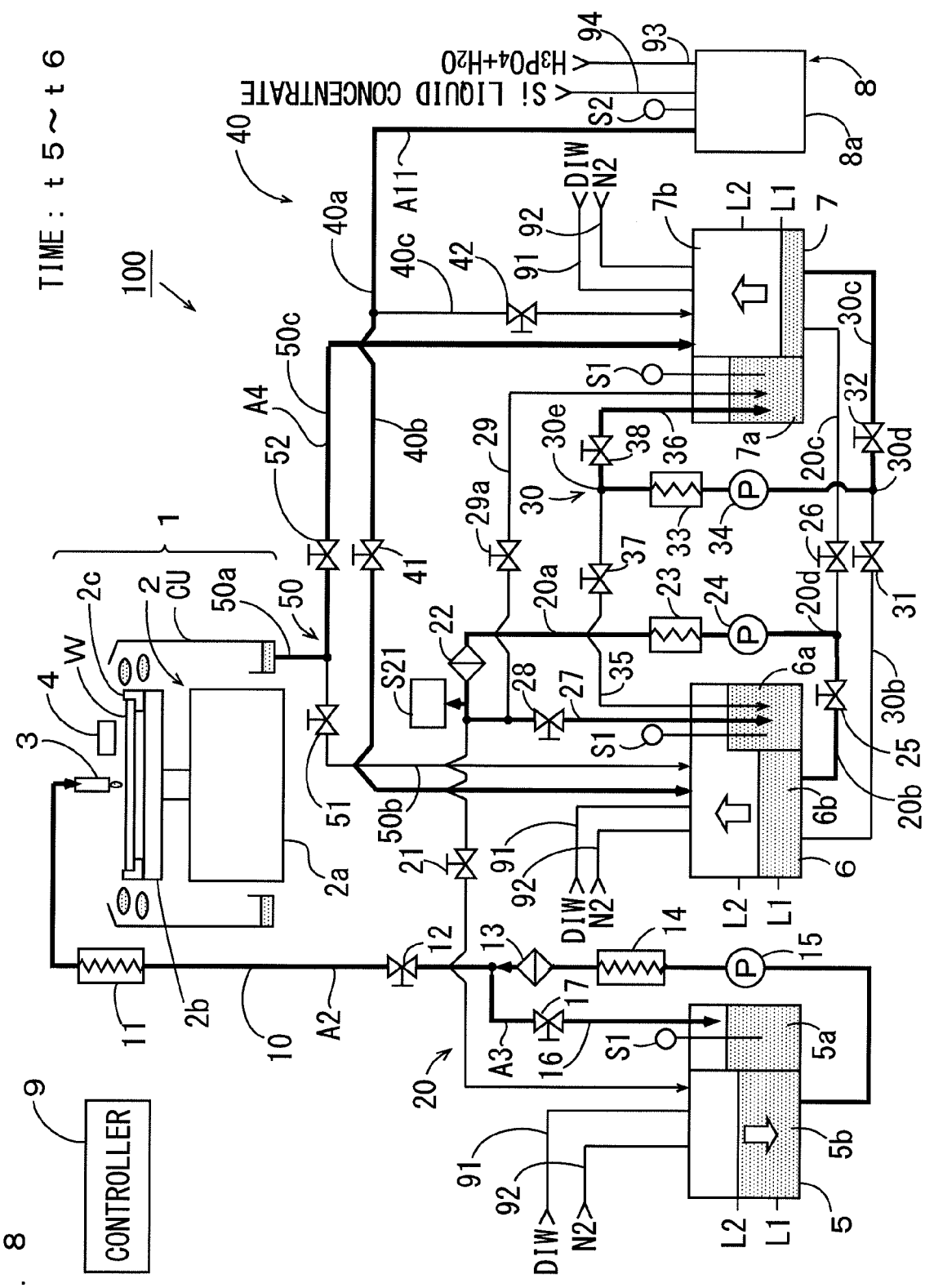
FIG. 8 is a schematic diagram showing an operation of the substrate processing apparatus from the time point t5 to the time point t6 of FIG. 2.

As shown in FIGS. 2 and 8, the supply of the phosphoric acid aqueous solution from the first tank 5 to the processor 1 is continued from the time point t5 to the time point t6, so that the height of the liquid surface in the storage tank 5b is lowered from the second reference height L2. Further, the liquid collection is continued in the third tank 7, so that the height of the liquid surface in the storage tank 7b is lifted from the first reference height L1. The liquid collection and a rapid increase in temperature of the collected used phosphoric acid aqueous solution by the heater 33 are performed in the third tank 7. Further, the phosphoric acid concentration adjustment is performed in the third tank 7 concurrently with this.

As shown in FIG. 2, the supply of the phosphoric acid aqueous solution is performed from the second tank 6 towards the first tank 5 from the time point t6. Thus, the height of the liquid surface in the storage tank 6b of the second tank 6 is lowered from the second reference height L2, and the height of the liquid surface in the storage tank 5b of the first tank 5 is lifted towards the second reference height L2. The supply of the phosphoric acid aqueous solution from the second tank 6 to the first tank 5 is performed until the height of the liquid surface in the first tank 5 reaches L2 (a time point t7).

From the time point t7, the operations from the time point t3 to the time point t5 and the operations from the time point t5 to the time point t7 are repeated until the processing for the substrate W in the processor 1 is stopped. Thus, in the first tank 5, the phosphoric acid aqueous solution having the reference phosphoric acid concentration and the reference silicon concentration is maintained at all times.

In the first tank 5, moisture of part of the phosphoric acid aqueous solution may evaporate. In this case, the phosphoric acid concentration of the phosphoric acid aqueous solution stored in the storage tank 5b changes. The controller 9 may perform the phosphoric acid concentration adjustment in the first tank 5 based on the output of the phosphoric acid concentration meter S1 of the first tank 5.

Further, when the phosphoric acid aqueous solution is not supplied to the first tank 5 due to a trouble with the apparatus and the like, the height of the liquid surface in the storage tank 5b may be lower than the first reference height L1. The controller 9 may output an abnormal signal when the output of the liquid surface sensor S3 of the first tank 5 is lower than the first reference height L1.

(3) Effects

In the substrate processing apparatus 100 according to one embodiment of the present invention, the phosphoric acid aqueous solution used in the processor 1 is collected and reused. The substrate processing apparatus 100 has two tanks (the second and third tanks 6, 7) for collecting the used phosphoric acid aqueous solution and switches between these two tanks 6, 7 to collect the used phosphoric acid aqueous solution. As described above, the temperature of the used phosphoric acid aqueous solution (the processing liquid) is considerably lower than the temperature suitable for the substrate processing, so that the first tank 5 cannot be replenished with the phosphoric acid aqueous solution from the tank to which the phosphoric acid aqueous solution is being collected. However, in this substrate processing apparatus 100, the first tank 5 can be replenished with the phosphoric acid aqueous solution from the tank 6 or 7 to which the used phosphoric acid aqueous solution is not collected. Therefore, the first tank 5 can be replenished with the phosphoric acid aqueous solution concurrently with the collection of the used phosphoric acid aqueous solution.

Because the temperature of the used phosphoric acid aqueous solution is considerably lower than the temperature suitable for the substrate processing, it is necessary to heat the phosphoric acid aqueous solution, in the tank to which the phosphoric acid aqueous solution is collected, by the heater having high output (normal rated power). Therefore, the heater that heats the phosphoric acid aqueous solution in the tank to which the phosphoric acid aqueous solution is collected (the heater 33 of the processing liquid circulation system 30) has the high output.

In contrast, a system of circulating the phosphoric acid aqueous solution in the tank to which the phosphoric acid aqueous solution is not collected, that is, the processing liquid replenishment system 20 only has to perform subtle temperature regulation such as simple retention of heat for the phosphoric acid aqueous solution that already has high temperature, whereby the output of the heater 23 inserted into this path may be relatively low. For example, the output of the heater 23 may be lower than the output of the heater 33.

If a heater having high output as the heater 33 is equipped at each of the two tanks 6, 7, the cost increases. In contrast, in this substrate processing apparatus 100, the processing liquid circulation system 30 that heats and circulates the phosphoric acid aqueous solution that is being collected is used by being switched between the two tanks 6, 7. In this case, it is not necessary to equip a heater having such high output at each of the two tanks 6, 7. Therefore, a reduction in cost of the substrate processing apparatus 100 can be realized.

A high flow rate circulation is necessary to increase the temperature of the phosphoric acid aqueous solution that has a decreased temperature. On the one hand, it may be relatively low flow rate circulation to circulate the phosphoric acid aqueous solution that has an already increased temperature. Therefore, the pump 34 inserted into the processing liquid circulation system 30 has a flow rate higher than the pump 24 inserted into the processing replenishment system 20.

(4) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the substrate W is an example of a substrate, the processing liquid nozzle 3 is an example of a processing liquid nozzle, the processor 1 is an example of a processing unit, and the first tank 5 is an example of a supply tank. The second and third tanks 6, 7 are respectively examples of first and second replenishment tanks, the collection pipe 50 is an example of a processing liquid collector, the processing liquid replenishment system 20 is an example of a processing liquid replenisher, and the processing liquid circulation system 30 is an example of a processing liquid circulator.

The heater 33 is an example of a heater, the controller 9 is an example of a controller, the substrate processing apparatus 100 is an example of a substrate processing apparatus, the heater 23 is an example of a temperature regulator, the circulation pipes 27, 29 and the valves 28, 29a are examples of a replenishment circulator. The cup CU is an example of a cup, the main pipe 50a and the branch pipes 50b, 50c are respectively examples of first to third collection pipes, and the valves 51, 52 are respectively examples of first and second collection valves.

The main pipe 20a, the branch pipes 20b, 20c and the circulation pipes 27, 29 are respectively examples of first to fifth replenishment pipes, the valves 25, 26, 28, 29a are respectively examples of first to fourth replenishment valves. The branch pipe 30b, the circulation pipe 35, the branch pipe 30c, the circulation pipe 36 and the main pipe 30a are respectively examples of first to fifth circulation pipes, and the valves 31, 37, 32, 38 are respectively examples of first to fourth circulation valves. The liquid surface sensor S3 of the second tank 6 and the liquid surface sensor S3 of the third tank 7 are respectively examples of first and second detection sensors, and the new liquid supply device 8 is an example of a new liquid supply device.

As each of constituent elements recited in the claims, various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for processing for substrates.

I claim:
1. A substrate processing apparatus comprising:
a processing unit including a processing liquid nozzle that supplies a processing liquid to a substrate;
a supply tank that supplies the processing liquid to the processing liquid nozzle;
a first replenishment tank and a second replenishment tank for replenishing the supply tank with the processing liquid;
a processing liquid collector connected to the processing unit to collect the processing liquid used in the processing unit and selectively supply the used processing liquid to the first and second replenishment tanks;
a processing liquid replenisher connected to the supply tank to selectively replenish the supply tank with the processing liquid from the first and second replenishment tanks;
a processing liquid circulator connected to the first and second replenishment tanks to selectively circulate the processing liquid in the first replenishment tank and the processing liquid in the second replenishment tank;

a heater that heats the processing liquid passing through the processing liquid circulator; and a controller configured to control the processing liquid replenisher to replenish the supply tank with the processing liquid in the second replenishment tank, and control the processing liquid circulator to circulate the processing liquid in the first replenishment tank while being heated by the heater, in a period in which the used processing liquid collected by the processing liquid collector is supplied to the first replenishment tank, and control the processing liquid replenisher to replenish the supply tank with the processing liquid in the first replenishment tank, and control the processing liquid circulator to circulate the processing liquid in the second replenishment tank while being heated by the heater, in a period in which the used processing liquid collected by the processing liquid collector is supplied to the second replenishment tank.

2. The substrate processing apparatus according to claim 1, further comprising a temperature regulator that regulates a temperature of the processing liquid passing through the processing liquid replenisher, wherein the processing liquid replenisher includes a replenishment circulator connected to the first and second replenishment tanks to be on standby for replenishing the supply tank with the processing liquid while circulating the processing liquid in the first and second replenishment tanks through the temperature regulator, and output of the temperature regulator is lower than output of the heater.

3. The substrate processing apparatus according to claim 2, wherein the replenishment circulator is connected to the first and second replenishment tanks to selectively circulate the processing liquid in the first replenishment tank and the processing liquid in the second replenishment tank.

4. The substrate processing apparatus according to claim 3, wherein the controller is configured to control the replenishment circulator to circulate the processing liquid in the first replenishment tank while a temperature of the processing liquid in the first replenishment tank is regulated by the temperature regulator, in a period in which the used processing liquid collected by the processing liquid collector is supplied to the second replenishment tank, and control the replenishment circulator to circulate the processing liquid in the second replenishment tank while a temperature of the processing liquid in the second replenishment tank is regulated by the temperature regulator, in a period in which the used processing liquid collected by the processing liquid collector is supplied to the first replenishment tank.

5. The substrate processing apparatus according to claim 2, wherein the processing unit includes a cup that is provided to surround the substrate and catches the used processing liquid, the processing liquid collector includes a first collection pipe connected to the cup of the processing unit, second and third collection pipes respectively connected between the first collection pipe and each of the first and second replenishment tanks, and first and second collection valves respectively inserted into the second and third collection pipes, the processing liquid replenisher includes a first replenishment pipe connected to the supply tank, second and third replenishment pipes respectively connected between the first replenishment pipe and each of the first and second replenishment tanks, and the first and second replenishment valves respectively inserted into the second and third replenishment pipes, the processing liquid circulator includes first and second circulation pipes connected to the first replenishment tank, third and fourth circulation pipes connected to the second replenishment tank, a fifth circulation pipe that is connected between the first circulation pipe and the second circulation pipe and is connected between the third circulation pipe and the fourth circulation pipe, and first, second, third and fourth circulation valves respectively inserted into the first, second third and fourth circulation pipes, and the controller opens the second replenishment valve, the first circulation valve and the second circulation valve and closes the first replenishment valve, the third circulation valve and the fourth circulation valve in opening the first collection valve and closing the second collection valve, and opens the first replenishment valve, the third circulation valve and the fourth circulation valve and closes the second replenishment valve, the first circulation valve and the second circulation valve in opening the second collection valve and closing the first collection valve.

6. The substrate processing apparatus according to claim 5, wherein the heater is inserted into the fifth circulation pipe of the processing liquid circulator.

7. The substrate processing apparatus according to claim 5, wherein the temperature regulator is inserted into the first replenishment pipe of the processing liquid replenisher.

8. The substrate processing apparatus according to claim 5, wherein the replenishment circulator includes fourth and fifth replenishment pipes respectively connected between the first replenishment pipe and each of the first and second replenishment tanks, and third and fourth replenishment valves respectively inserted into the fourth and fifth replenishment pipes, and the controller opens the fourth replenishment valve and closes the third replenishment valve in opening the first collection valve and closing the second collection valve, and opens the third replenishment valve and closes the fourth replenishment valve in opening the second collection valve and closing the first collection valve.

9. The substrate processing apparatus according to claim 1, further comprising each of first and second detection sensors that detects an amount of the processing liquid in each of the first and second replenishment tanks, wherein the controller controls the processing liquid collector to switch between a period in which the used processing liquid is supplied to the first replenishment tank and a period in which the used processing liquid is supplied to the second replenishment tank based on the amount of the processing liquid detected by each of the first and second detection sensors.

10. The substrate processing apparatus according to claim 1, further comprising a new liquid supply device that supplies the processing liquid to the supply tank, the first replenishment tank or the second replenishment tank.

* * * * *